US008551580B2

(12) United States Patent
Urushihara et al.

(10) Patent No.: US 8,551,580 B2
(45) Date of Patent: *Oct. 8, 2013

(54) METHOD FOR PRODUCING POLYCRYSTALLINE SILICON

(75) Inventors: Makoto Urushihara, Naka-gun (JP); Kazuki Mizushima, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 362 days.

This patent is subject to a terminal disclaimer.

(21) Appl. No.: 12/805,926

(22) Filed: Aug. 25, 2010

(65) Prior Publication Data
US 2011/0052914 A1    Mar. 3, 2011

(30) Foreign Application Priority Data
Aug. 28, 2009   (JP) .................................. 2009-199008

(51) Int. Cl.
*C23C 16/24*    (2006.01)

(52) U.S. Cl.
USPC ..................... 427/543; 427/591; 427/255.393

(58) Field of Classification Search
USPC ................... 427/543, 255.393, 591
See application file for complete search history.

(56) References Cited

U.S. PATENT DOCUMENTS

| | | | |
|---|---|---|---|
| 4,179,530 A | 12/1979 | Koppl et al. | |
| 6,007,869 A * | 12/1999 | Schreieder et al. | 427/213 |
| 6,284,312 B1 * | 9/2001 | Chandra et al. | 427/237 |
| 6,365,225 B1 * | 4/2002 | Chandra et al. | 427/237 |
| 7,732,012 B2 * | 6/2010 | Hongu et al. | 427/255.27 |
| 7,816,269 B2 * | 10/2010 | Aslami et al. | 438/689 |
| 2002/0014197 A1 * | 2/2002 | Keck et al. | 117/87 |
| 2004/0091630 A1 * | 5/2004 | Sonnenschein | 427/428.1 |
| 2007/0034146 A1 * | 2/2007 | Nakashima et al. | 117/200 |
| 2007/0148075 A1 | 6/2007 | Popken et al. | |
| 2007/0248521 A1 * | 10/2007 | Kutsovsky et al. | 423/324 |
| 2009/0136666 A1 * | 5/2009 | Endoh et al. | 427/255.18 |
| 2009/0209093 A1 * | 8/2009 | Aslami et al. | 438/488 |
| 2009/0229991 A1 * | 9/2009 | Wallmeier | 205/341 |
| 2011/0014468 A1 * | 1/2011 | Urushihara et al. | 428/398 |
| 2011/0274851 A1 * | 11/2011 | Miyazawa et al. | 427/546 |
| 2012/0058022 A1 * | 3/2012 | Revankar et al. | 422/187 |
| 2012/0100302 A1 * | 4/2012 | Fabry et al. | 427/534 |

FOREIGN PATENT DOCUMENTS

| | | |
|---|---|---|
| JP | 60-077115 A | 5/1985 |
| JP | 2003-128492 A | 5/2003 |
| JP | 2007-526203 T | 9/2007 |

OTHER PUBLICATIONS

Vallera, Antonio, et al., "Linear electric molten zone in semiconductors". Applied Physics Letters 90, 232111 (2007), pp. 1-3.*
Del Coso, G., et al., "Increase on Siemens Reactor Throughput by Tailoring Temperature Profile of Polysilicon Rods". IEEE, 2007, pp. 25-28.*

*Primary Examiner* — Bret Chen
(74) *Attorney, Agent, or Firm* — Edwards Wildman Palmer LLP; James E. Armstrong, IV (57) ABSTRACT

A polycrystalline silicon producing method with preventing meltdown and maintaining a high growing rate and a high yield by increasing temperature of raw material gas before supplying them to a reactor in a high pressure state so as to lower convection heat transfer from a silicon rod, including: supplying electric current to a silicon seed rod in a reactor to make the silicon seed rod to generate heat; and supplying a large amount of preheated raw material gas including chlorosilanes to the silicon seed rod in the reactor in the high pressure state.

11 Claims, 9 Drawing Sheets

METHOD FOR PRODUCING POLYCRYSTALLINE SILICON

BACKGROUND OF THE INVENTION

1. Field of the Invention

The present invention relates to a method and an apparatus for producing polycrystalline silicon and polycrystalline silicon produced by the method or the apparatus for producing polycrystalline silicon.

Priority is claimed on Japanese Patent Application No. 2009-199008, filed Aug. 28, 2009, the content of which is incorporated herein by reference.

2. Description of the Related Art

As a polycrystalline silicon producing method, a method of producing by the Siemens method has been known. According to this polycrystalline silicon producing method, a plurality of silicon seed rods stand upright in a reactor and are supplied electric current and heated, and raw material gas including chlorosilane gas and hydrogen gas is supplied to the reactor to bring the raw material gas into contact with the heated silicon seed rods. On the surface of the heated silicon seed rods, polycrystalline silicon is deposited by heat decomposition or hydrogen reduction of the raw material gas and grows in a rod shape. In this case, every two silicon seed rods are paired and the upper end portions thereof are connected to each other by a connecting member made of the same silicon as the silicon seed rod so that they are formed in an inverted (upside-down) U-shape or a Π-shape.

In the polycrystalline silicon producing method, there is a method of increasing an amount of raw material supply as one of methods of increasing a growing rate of polycrystalline silicon.

According to Japanese Unexamined Patent Application, First Publication No. 2003-128492, it is described that, when a supply amount of raw material gas is small, the deposition of polycrystalline silicon is insufficient, and by sufficiently supplying the raw material gas, a polycrystalline silicon growing rate increases. In addition, in Japanese Unexamined Patent Application, First Publication No. 2003-128492, it is described that an amount of raw material gas supply per unit surface area of a rod is controlled in the range of $3.0 \times 10^{-4}$ to $9.0 \times 10^{-4}$ mol/cm$^2$ min.

On the other hand, it is not preferable that raw material gas is excessively to supplied because a ratio of the raw material gas contributing to the deposition reaction of polycrystalline silicon decreases, and thus a deposition amount of polycrystalline silicon per an amount of raw material gas supply (yield of the polycrystalline silicon) decreases.

Accordingly, it can be considered that by increasing an amount of raw material supply under the condition where the pressure in a reactor is increased, a growing rate is increased while the decrease of yield is suppressed. U.S. Pat. No. 4,179,530 describes that polycrystalline silicon is produced at a pressure of 1 to 16 bars, and preferably 4 to 8 bars. In addition, Published Japanese Translation No. 2007-526203 of the PCT International Publication describes that, although the Siemens method is not employed, heat deposition of raw material gas and deposition of polycrystalline silicon are achieved at a pressure of 1 millibar to 100 bar (absolute pressure).

According to Japanese Unexamined Patent Application, First Publication No. S60-77115, a wall of a reactor has a double structure in which granulated silicon or the like is filled. Hydrogen gas or inert gas is preheated by flowing through the granulated silicon filler, and introduced into the reactor.

SUMMARY OF THE INVENTION

Problems to be Solved by the Invention

As described above, when the inside of the reactor is made to be in a high pressure state and a large amount of the raw material gas is then supplied, the growing rate of polycrystalline silicon can be increased while maintaining the yield. Accordingly, it is thought that polycrystalline silicon can be efficiently produced.

In a polycrystalline silicon rod such as a recharge rod for CZ (Czochralski method) or a rod for FZ (Floating Zone method) for use in producing of singlecrystalline silicon for semiconductors, a large rod diameter can efficiently produce singlecrystalline silicon. Accordingly, for example, a polycrystalline silicon rod having a diameter of 100 mm or more is required. Moreover, it is desirable that the polycrystalline silicon has a smooth surface.

However, according to the examination of the inventors of the present invention, when the inside of reactor is made to be in a high pressure state and a large amount of the raw material gas is then supplied while adjusting the electric current so that the surface temperature of the silicon rod is maintained in a prescribed range, a rate of gas flow brought into contact with the surface of a rod increases, so the convection heat transfer from the silicon rod to the gas increases. At this time, in order to maintain the surface temperature of the rod at a temperature suitable for the growth of the silicon rod, it is required to increase the current value in the silicon seed rod. By increasing the current value, the temperature of the center portion of the silicon rod which is compared to the case of a normal pressure or a normal flow rate is increased. For this reason, when the rod grows to some extent, the temperature of the connecting portion between the silicon seed rod and the connecting member increases and thus meltdown (fusing) is caused and a problem occurs in that the rod cannot be grown to have a large diameter of, for example, 100 mm or larger. The producing of polycrystalline silicon by the Siemens method employs a batch system. Since an operation of taking the silicon rod out of the reactor is performed, when the rod after the growth is thin, the productivity decreases.

In order to prevent the meltdown, it can be considered that the surface temperature of the rod is lowered by adjusting the electric current supplying the silicon seed rod. However, when the surface temperature of the rod is lowered, the growing rate of the silicon rod and the yield decrease and thus polycrystalline silicon cannot be efficiently grown. In addition, since the difference between the center temperature and the surface temperature of the rod is large, cracking easily occurs in the silicon rod due to heat stress in a stage of cooling the silicon rod to room temperature after the growth.

In this case, by preheating the raw material gas, it is considered that the convection heat transfer from the silicon rod to the gas can be reduced. However, by the method of the Japanese Unexamined Patent Application, First Publication No. S60-77115, since the gas should be supplied through the granulated silicon filler inside a double-wall, the pressure loss may be occurred, so that it is difficult to supply a large amount of the raw material gas. Also, in order to increase the pressure in the reactor, the structure of the reactor should be complicated for the pressure tightness. Therefore, it is difficult to product silicon under high pressure. As a result, since a large amount of the raw material gas cannot be supplied under high pressure, it is impossible to grow silicon with high growing rate and yield.

Means for Solving the Problem

The present invention is contrived in view of the circumstances; and an object of the present invention is, in the producing of polycrystalline silicon, to maintain high yield and a high growing rate under the condition where a large amount of raw material gas is supplied at a high pressure, to prevent the meltdown of a silicon rod, and to make a silicon rod having a smooth surface and a large diameter.

As described above, when the inside of the reactor is made to be in a high pressure state and a large amount of the raw material gas is then supplied while adjusting the electric current so that the surface temperature of the silicon rod is maintained in a prescribed range, a rate of gas flow increases, so the convection heat transfer from the silicon rod to the gas increases. Therefore, the temperature of the center portion of the silicon rod is excessively is increased, so that the silicon rod is apt to be molten and cannot grow to have a large diameter, e.g., more than 100 mm. If the surface temperature of the silicon rod is lowered by adjusting the electric current to the silicon seed rod, the silicon rod can grow to a large diameter with preventing the meltdown. However, the growing rate and yield are deteriorated by this method. Therefore, the inventors of the present invention invent a method to grow the diameter of the silicon rod to more than 100 mm with preventing the meltdown and maintaining the high growing rate and the yield by increasing the temperature of the raw material gas before supplying them to the reactor so as to lower the convection heat transfer from the silicon rod.

That is, a polycrystalline silicon producing method of the present invention includes: supplying electric current to a silicon seed rod in a reactor to make the silicon seed rod to generate heat; supplying raw material gas including chlorosilanes to the silicon seed rod; and depositing polycrystalline silicon on a surface of the silicon seed rod to be grown as a silicon rod. Pressure in the reactor is maintained to equal to or greater than 0.4 MPa and equal to or less than 0.9 MPa. A surface temperature of the silicon rod is maintained in a range equal to or higher than 1000° C. and equal to or lower than 1100° C. The raw material gas is preheated to a range equal to or higher than 150° C. and equal to or lower than 600° C. and then supplied to the reactor so as to maintain a chlorosilanes supply amount per unit time and per unit surface area in a range equal to or greater than $2.0 \times 10^{-7}$ mol/sec/mm$^2$ and equal to or less than $3.0 \times 10^{-7}$ mol/sec/mm$^2$ with growth of a diameter of the silicon rod.

In this producing method, the pressure in the reactor is equal to or greater than 0.4 MPa and equal to or less than 0.9 MPa, the chlorosilanes supply amount per unit time and per surface unit area of the silicon rod is maintained in the range equal to or greater than $2.0 \times 10^{-7}$ mol/sec/mm$^2$ and equal to or less than $3.0 \times 10^{-7}$ mol/sec/mm$^2$, which is larger supply amount than in conventional cases. Moreover, the raw material gas is preheated in the range equal to or higher than 150° C. and equal to or lower than 600° C. and then supplied to the reactor, so that the convection heat transferred from the silicon rod to the gas is reduced. As a result, the growing rate is improved, the high yield is maintained and the diameter of the silicon rod can grow larger with preventing the meltdown owing to the ascent of the temperature of the center portion of the silicon rod.

If the pre-heat temperature of the raw material gas is lower than 150° C., the effect of restraining the convection heat transfer from the silicon rod to the gas is small, the diameter of the silicon rod cannot grow more than 100 mm when the supply amount of chlorosilanes per unit time and per unit area is small (i.e., less than $2.0 \times 10^{-7}$ mol/sec/mm$^2$). On the other hand, if the pre-heat temperature of the raw material is higher than 600° C., the effect is saturated, it is not cost-effective, and the high temperature has a bad effect on metal materials of a preheating device or the reactor. Moreover, if the surface temperature of the silicon rod is lower than 1000° C., the growing rate of polycrystalline silicon is slow, so it is hard to the silicon rod to grow fast. On the other hand, in order to maintain the surface temperature of the silicon rod higher than 1100° C., it is necessary to supply a large amount of the electric current. As a result, the temperature of the center portion of the silicon rod is excessively increased, and it is hard to prevent the meltdown although the raw material gas is preheated.

When the pressure exceeds 0.9 MIN, a problem occurs in the pressure-resistance design, such as an extreme increase in a flange thickness or the like. On the other hand, when the pressure is less than 0.4 MPa, yield is decreased over the whole process. In addition, when pressure loss is considered, the pipe diameter is increased in order to flow a large amount of the gas and thus the structure under the reactor or the bottom plate of the reactor becomes complicated.

When the supply amount of chlorosilanes exceeds $3.0 \times 10^{-7}$ mol/sec/mm$^2$, the yield of polycrystalline silicon is decreased. In addition, the loss by the convection heat transfer from the silicon rod to the gas is large. Therefore, although the raw material gas is preheated to 600° C., the silicon rod is hard to grow more than 100 mm. On the other hand, the supply amount of chlorosilanes is less than $2.0 \times 10^{-7}$ mol/sec/mm$^2$, polycrystalline silicon cannot grow fast. In addition, since irregularities are formed on the surface of the polycrystalline silicon rod, it is not possible to produce polycrystalline silicon having a smooth surface suitable for producing single crystalline silicon for semiconductors.

In the Siemens method, a silicon seed rod having a square cross-section is used. However, whether this cross-section of the silicon seed rod is grown round or not has large effect on the surface state of a finally produced polycrystalline silicon rod. In order to make a rod round, it is necessary to sufficiently supply raw material gas. According to the polycrystalline silicon producing method of the present invention, a large amount of raw material gas is supplied and thus a rod having a square cross-section is grown into a polycrystalline silicon rod having a sufficiently round cross-section.

In the producing method of the present invention, it is efficient that the raw material gas is preheated by heat exchange between a discharge gas from the reactor and the raw material gas before being supplied to the reactor.

In the producing method of the present invention, it is desirable that temperature of an inner surface of the reactor wall be adjusted to be equal to or higher than 250° C. and equal to or lower than 400° C. When the temperature of the inner surface of the reactor wall is increased in advance, the heat quantity that is transmitted to the inner wall of the reactor by the radiation from the silicon rod can be reduced. That is, while suppressing an increase in the temperature of the center portion of the silicon rod, the growing rate of the polycrystalline silicon can be increased.

In addition, the producing method of the present invention, in the reactor, it is desirable that a raw material gas-supply nozzle for the raw material gas be disposed further from an inner surface of the reactor wall than the silicon seed rod positioned at the outermost circumference.

The silicon rods (or the silicon seed rods) positioned so as to be directly opposed to the inner wall of the reactor, so that a large heat quantity is transmitted to the inner wall of the reactor by the radiation from the surface of the silicon rods. Further, in a case in which the supply nozzle for the material gas is disposed between the silicon seed rod and the inner wall surface of the reactor, the heat quantity of the silicon seed rods escapes by the low-temperature gas. Therefore, meltdown of the silicon rods is easily caused. When the raw material gas-supply nozzle supplying the raw material gas is not disposed in the vicinity of the inner wall of the reactor, the convection heat transfer can be reduced, and the meltdown can be prevented.

In the producing method of the present invention, it is more preferable that the pre-heat temperature be in a range equal to or higher than 150° C. and equal to or lower than 400° C. Conventionally, a pre-heater of the raw material gas is made from metal material. When the pre-heat temperature of the raw material gas exceeds 400° C., impurities are incorporated into the raw material gas from the metal material of the pre-heater. If impurities are incorporated into the raw material gas, since high-purity is desired for the semiconductors, the raw material gas is not suitable for polycrystalline silicon for use in semiconductors. Therefore, in order to produce high-purity polycrystalline silicon for semiconductors, it is preferable that the pre-heat temperature be in the range equal to or higher than 150° C. and equal to or lower than 400° C. In addition, even when the raw material gas is heated to equal to or higher than 400° C. to produce the polycrystalline silicon, the polycrystalline silicon can be used in solar cells which are admissible if more impurities are incorporated therein than that for semiconductors.

The polycrystalline silicon which is produced by the above-described method can be made to have a diameter of 100 mm or larger while a high growing rate and yield are maintained.

An apparatus for producing polycrystalline silicon according to the present invention, that produces a silicon rod by supplying raw material gas including chlorosilanes to a silicon seed rod which is heated in a reactor so as to deposit polycrystalline silicon on the silicon seed rod, having: the reactor; the silicon seed rod which is disposed in the reactor; a pressure controller which controls an inner pressure of the reactor in a range equal to or larger than 0.4 MPa and equal to or lower than 0.9 MPa; a raw material gas-supply source which supplies the raw material gas; a raw material gas-controller which controls a supply amount of the raw material gas from the raw material gas-supply source; a pre-heater which preheats the raw material gas in a range equal to or higher than 150° C. and equal to or lower than 600° C.; a thermometer which measures a surface temperature of the silicon rod; a power supply which supplies electric current to and heat the silicon seed rod; and a current control device which controls the surface temperature of the silicon rod measured by the thermometer in a range equal to or higher than 1000° C. and equal to or lower than 1100° C. In the apparatus, the supply amount of the raw material gas is controlled by the raw material gas-controller so that a supply amount of chlorosilanes included in the raw material gas is in a range equal to or larger than $2.0 \times 10^{-7}$ mol/sec/mm$^2$ and equal to or smaller than $3.0 \times 10^{-7}$ mol/sec/mm$^2$ in accordance with a surface area of the growing silicon rod.

In the apparatus for producing polycrystalline silicon, the pre-heater may be a heat exchanger which exchanges heats between a discharge gas from the reactor and the raw material gas before being supplied to the reactor.

In the apparatus for producing polycrystalline silicon, it is preferable that the reactor have a double-wall in which a coolant flows therein, and inner surface temperature of the reactor wall be maintained in a range equal to or higher than 250° C. and equal to or lower than 400° C. by controlling temperature and a flow rate of the coolant.

In the apparatus for producing polycrystalline silicon, it is preferable that the reactor be provided with a raw material gas-supply nozzle which is connected to the raw material gas-supply source and is disposed further from an inner surface of the reactor than a silicon seed rod positioned at the outermost circumference.

Effects of the Invention

According to the polycrystalline silicon producing method of the present invention, a large amount of raw material gas is supplied at high pressure, so the silicon rod can be grown in a short time with maintaining high yield. In addition, since the raw material gas which is supplied to the reactor is preheated, the convection heat transfer from the silicon rod to the gas is reduced, so that the meltdown by increasing the temperature of the center portion of the silicon rod is prevented. Accordingly, a large-diameter polycrystalline silicon rod can be produced in the shortest time in a state in which the amount of polycrystalline silicon deposition per the amount of chlorosilanes supply is at high level.

DETAILED DESCRIPTION OF THE INVENTION

Hereinafter, an embodiment of a polycrystalline silicon producing method to according to the present invention will be described with reference to the drawings.

Figure 1:
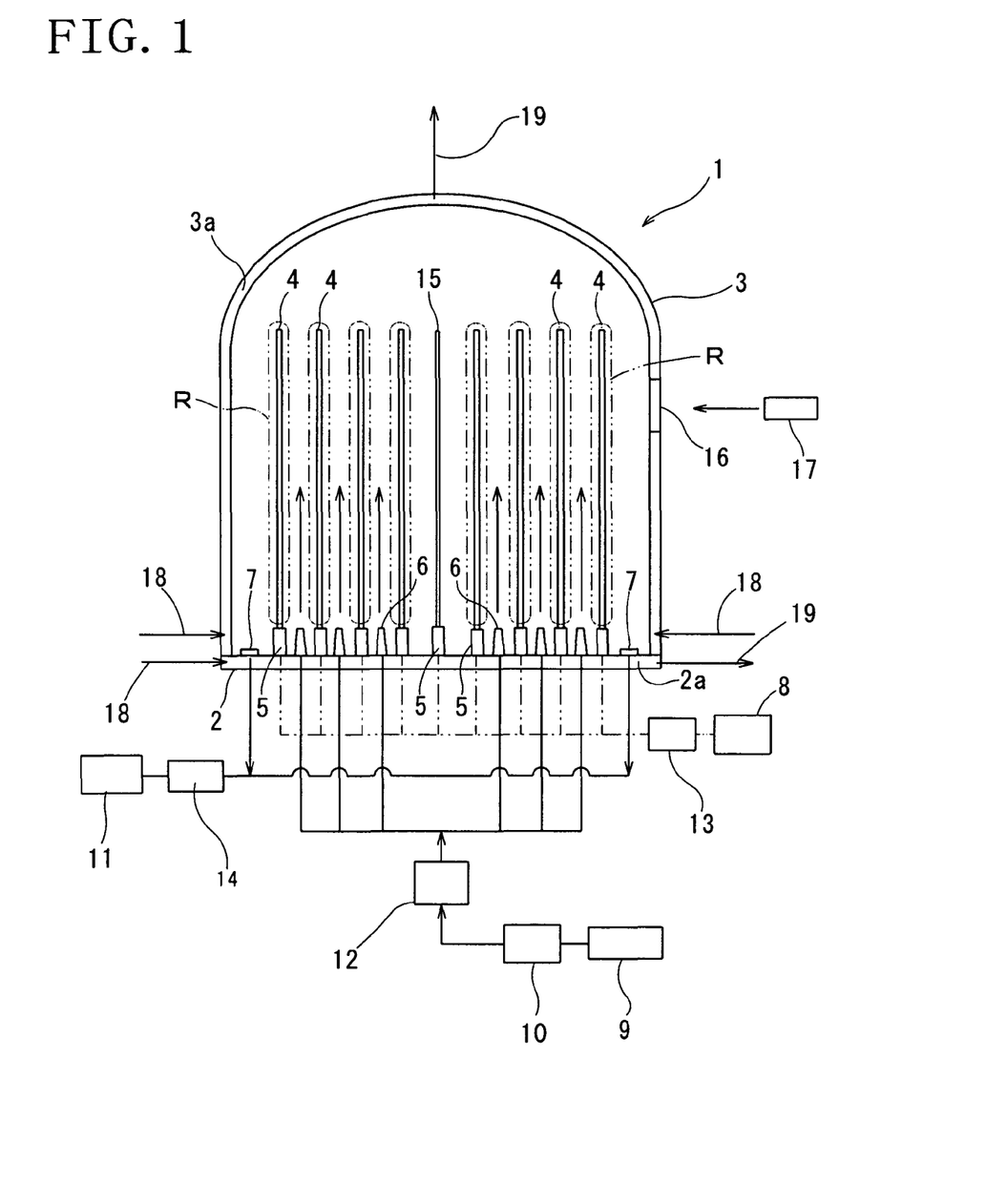
FIG. 1 is a constructive cross-sectional view of a reactor showing a producing apparatus which is used for a producing method of polycrystalline silicon of an embodiment according to the present invention.

FIG. 1 is an overall view of a polycrystalline silicon producing apparatus used in the producing method according to the present invention. The polycrystalline silicon producing apparatus has a reactor 1. The reactor is provided with a bottom plate 2 constituting the bottom of the reactor and a bell-shaped bell jar 3 fixed on the bottom plate 2.

As shown in FIG. 1, on the bottom plate 2, a plurality of electrodes 5 to which silicon seed rods 4 are installed, a plurality of ejection nozzles (raw material gas-supply nozzles) 6 for ejecting raw material gas including chlorosilanes and hydrogen gas to the inside of the reactor, and a plurality of gas discharge ports 7 for discharging the gas outside the reactor after the reaction are provided.

The electrodes 5 are made of carbon formed in a substantially cylindrical shape. The electrodes 5 are disposed in a substantially concentric pattern (concentric circles) with certain intervals therebetween on the bottom plate 2 and stand vertically upright on the bottom plate 2. Each of the electrodes 5 is connected to an external power supply 8 of the reactor 1. The amount of the electric current is adjusted by a current control device 13, and electric current is supplied to the silicon seed rods 4 via the electrodes 5. At the upper end portion of the electrode 5, a hole (not shown) is formed along the axis thereof and the lower end portion of the silicon seed rod 4 is inserted into the hole to install the silicon seed rod 4.

The silicon seed rod 4 is fixed so that the lower end thereof is put in the electrode 5, and stands upright so as to extend upward. By a connecting member (not shown) made of the same silicon as the silicon seed rod 4, every two silicon seed rods 4 are connected to each other at upper end portions thereof and they are assembled in an inverted (upside-down) U-shape or a Π-shape.

The plurality of ejection nozzles 6 of the raw material gas are installed with suitable intervals therebetween and dispersed on almost all parts of the upper surface of the bottom plate 2 of the reactor 1 so that the raw material gas is uniformly supplied to the silicon seed rods 4. These ejection nozzles 6 are connected to an external raw material gas-supply source 9. A raw material gas-supply source 9 is provided with a raw material gas-adjuster 10. By the raw material gas-adjuster 10, an amount of raw material gas supply from the ejection nozzles 6 can be adjusted. The plurality of gas discharge ports 7 are installed with suitable intervals therebetween on a portion adjacent to the outer circumference of the bottom plate 2, and are connected to a discharge gas treatment system 11 via a pressure controller 14. The pressure controller 14 is, for example, a pressure control valve which maintains the inner pressure of the reactor 1 as a prescribed intensity.

In the reactor 1, the ejection nozzles 6 are not disposed between the silicon seed rods 4 positioned at an outermost circumference and the inner surface of the reactor 1. That is, the ejection nozzles 6 are disposed further from the inner surface of the reactor 1 than the silicon seed rods 4 positioned at the outermost circumference. The silicon seed rods 4 positioned at the outermost circumference are directly opposed to the inner wall of the reactor 1, so that a large heat quantity is transmitted to the inner wall of the reactor 1 by the radiation from the surface of the silicon rods (hereinafter, "rods") R which are formed by depositing polycrystalline silicon. Further, in a case in which the ejection nozzles 6 are disposed between the rods R and the inner wall surface of the reactor 1, the heat quantity of the rods R escapes by the low-temperature raw material gas. Therefore, the meltdown is easily caused. When a structure in which no ejection nozzles 6 are disposed on that side is employed, the convection heat transfer from the rods R positioned at the outermost circumference to the gas can be suppressed, so as to decrease the possibility of a meltdown.

A pre-heater 12 for heating the raw material gas before being supplied to the reactor 1 is provided between the raw material gas-adjuster 10 and the reactor 1. The raw material gas is adjusted by the raw material gas-adjuster 10, flows through the pre-heater 12, and then is supplied to the reactor 1 in a preheated state.

At the center portion of the reactor 1, a heater 15 made of carbon is provided as a heating apparatus so as to be assembled in an inverted (upside-down) U-shape or a Π-shape on the electrode 5 of the bottom plate 2 and to stand upright. The heater 15 heats the silicon seed rods 4 adjacent to the center portion with radiation heat in an initial operating stage.

An observation window 16 is provided in the wall of the bell jar 3 and the surface temperature of the rod R in the reactor 1 can be measured by a radiation thermometer (a thermometer) 17 from the outside.

The bottom plate 2 and the bell jar 3 of the reactor 1 are formed in a double walled structure and coolant can be circulated in interior space portions 2a and 3a thereof. In FIG. 1, the reference symbol 18 represents a coolant supply tube, and the reference symbol 19 represents a coolant discharge tube.

A method of producing polycrystalline silicon by using the polycrystalline silicon producing apparatus constituted as mentioned above will be described.

First, by supplying electric current to the electrodes 5 which are connected to the silicon seed rods 4 and the heater 15 disposed at the center of the reactor 1, the heater 15 and the silicon seed rods 4 generate heat. At this time, since the heater 15 is made of carbon, the heater 15 generates heat earlier than the silicon seed rods 4, and heats the adjacent silicon seed rods 4 (adjacent to the center portion of the reactor 1) by the radiation heat. When the temperature of the silicon seed rods 4 is increased to a degree that the silicon seed rods 4 can be conductive, the silicon seed rods 4 are also in a resistance heat-generation state due to the electric current from the electrodes 5 thereof. Thus, the heat is gradually transferred in a radial direction or the like of the reactor 1 from the silicon seed rods 4 adjacent to the center portion of the reactor 1, and finally, the electric current is supplied to all the silicon seed rods 4 in the reactor 1 and enter a heat-generation state.

On the other hand, the raw material gas is supplied to the reactor 1 from the raw material supply source 9 via the pre-heater 12. By increasing the temperature of the silicon seed rods 4 up to a decomposition temperature of the raw material gas, the raw material gas ejected from the ejection nozzles 6 is thermally decomposed (or hydrogen-reduced) on the surface of the silicon seed rods 4, so that polycrystalline silicon is deposited on the surface of the silicon seed rods 4. The deposited polycrystalline silicon grows radially, as shown by two-dot lines in FIG. 1, into the polycrystalline silicon rod R. The discharge gas after the deposition of the polycrystalline silicon is sent to the discharge gas treatment system 11 from the gas discharge ports 7 in the inner bottom portion of the reactor 1.

In the polycrystalline silicon producing process, the raw material gas is preheated equal to or higher than 150° C. and equal to or lower than 600° C. by the pre-heater 12 before being supplied to the reactor 1. Further, the electric current value supplied to the silicon seed rods 4, a supply amount per unit time of the raw material gas having chlorosilanes, and the like are adjusted. Chlorosilanes have trichlorosilane as a main component. However, monochlorosilane, dichlorosilane, silicon tetrachloride, polymers (for example, $Si_2Cl_6$) and the like may be included therein.

In order to uniformly deposit polycrystalline silicon over the entire surface of the rod R, a supply amount F of chlorosilanes per unit surface area of the rod R and per unit time is maintained so as to be in a range equal to or greater than $2.0 \times 10^{-7}$ mol/sec/mm$^2$ and equal to or less than 3.0 mol/sec/mm$^2$, which is larger than in a conventional process of a normal pressure type reactor. Accordingly, with increasing of the diameter RD of the rod R (hereinafter, referred to as "a rod diameter RD"), a supply amount of the raw material gas supplied to the vicinity of the rod R is increased. The pressure in the reactor 1 is adjusted to be equal to or greater than 0.4 MPa and equal to or less than 0.9 MPa (absolute pressure). When the pressure is too low, the raw material gas cannot be supplied to the reactor 1 owing to pressure loss. The upper limit of the pressure is decided on the basis of pressure capacity of the reactor 1.

Furthermore, in the present producing process of the polycrystalline silicon, in addition to the adjustment of the supply amount of the raw material gas, current value "I" is adjusted to be increased so that a surface temperature Ts of the rod R is maintained so as to be substantially constant in the range equal to or higher than 1000° C. and equal to or lower than 1100° C. along with the increasing of the rod diameter RD.

The current value I and the supply amount of the raw material gas are decided by steps shown in FIGS. 2 to 5. S1 to S11 mentioned below correspond steps in the drawings.

Figure 2:
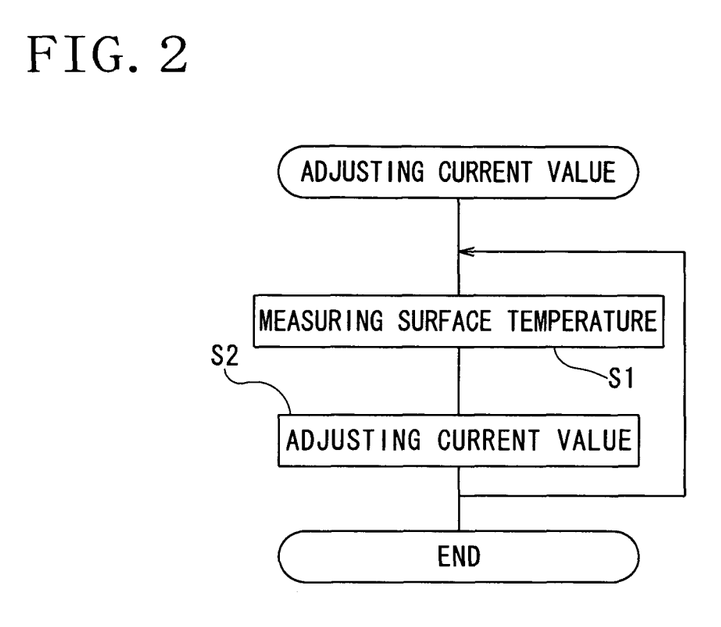
FIG. 2 is a flow chart showing a current control of the present invention.

The current value I is adjusted as shown in FIG. 2. That is, first, the surface temperature Ts is measured by the radiation thermometer 17 through the observation window 16 of the reactor 1 (S1). Then, the supplied current value I is adjusted so that the surface temperature Ts of the rod R is desired temperature equal to or higher than 1000° C. and equal to or lower than 1100° C. Thus, by controlling (adjusting) the current value I supplied to the silicon seed rods 4, the surface temperature Ts of the rod R is maintained in the range equal to or higher than 1000° C. and equal to or lower than 1100° C. While the producing process of the polycrystalline silicon is performed, by repeating the Steps S1 to S2, the current value I is progressively adjusted, so that the surface temperature Ts is maintained as constant value.

Figure 3:
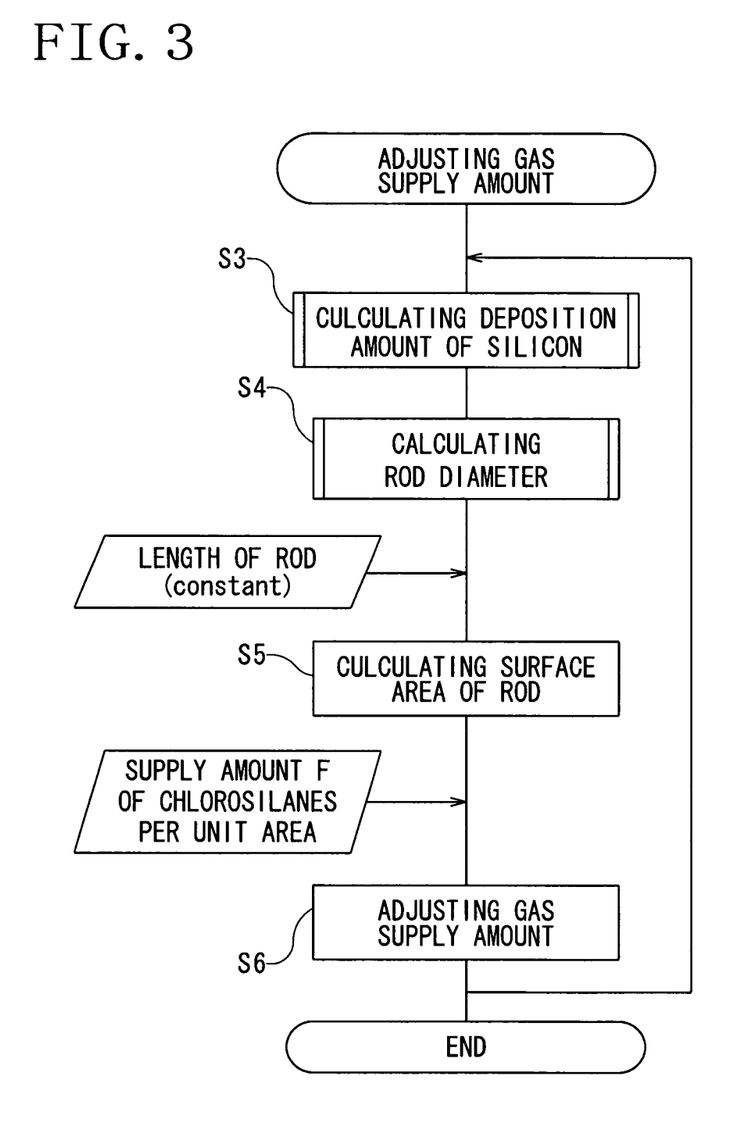
FIG. 3 is a flow chart for calculating a supply amount of raw material gas of the present invention.

The supply amount of the raw material gas per unit time is decided as shown in FIG. 3. That is, first, the deposition amount of polycrystalline silicon is calculated in Step S3, the rod diameter RD is calculated in Step S4, and a surface area of the rod R is calculated in Step S5 from the deposition amount, the rod diameter, and a length (constant value) of the rod R. Then, on the basis of the surface area of the rod R and the supply amount F of the chlorosilanes per unit surface area as mentioned above, the supply amount of the raw material gas per unit time is decided (S6).

Figure 4:
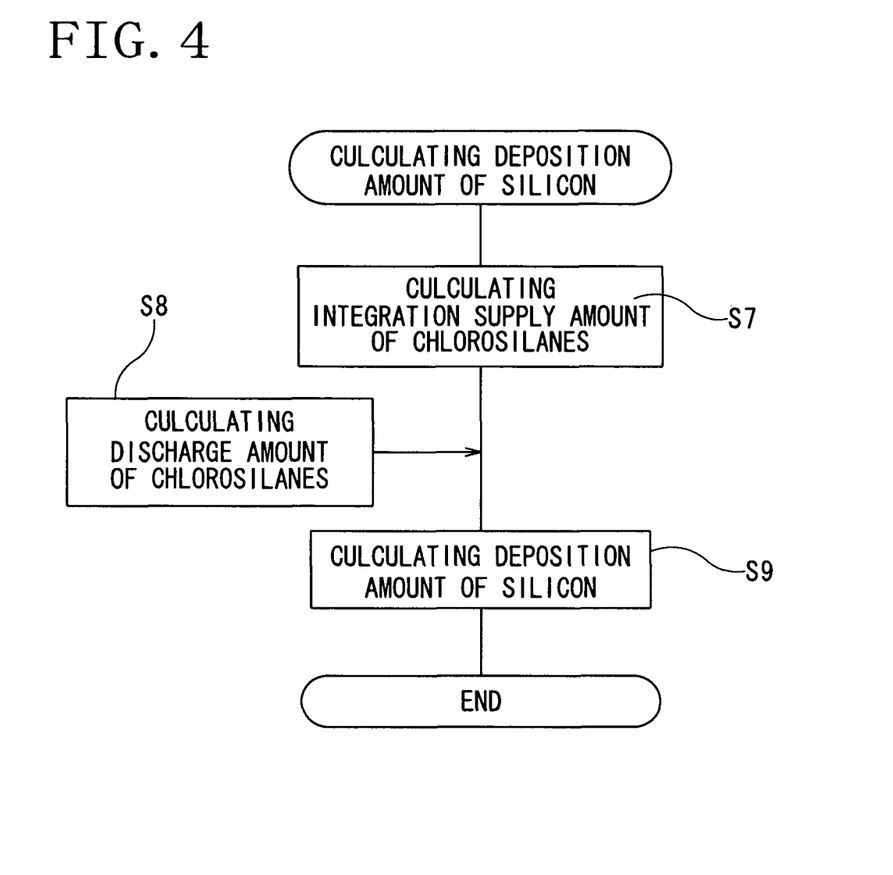
FIG. 4 is a flow chart for calculating deposition amount of polycrystalline silicon of the present invention.

Step S3 for calculating the weight (the deposition amount) of polycrystalline silicon will be described with reference to FIG. 4. The deposition amount of polycrystalline silicon is decided by calculating an integration supply amount of chlorosilanes from an integration supply amount of the raw material gas in Step S7, calculating a discharge amount of chlorosilanes by composition analysis of the discharge gas from the reactor 1 using gas chromatography or the like in Step S8, and then calculating from the integration supply amount and the discharge amount of chlorosilanes Step S9.

Figure 5:
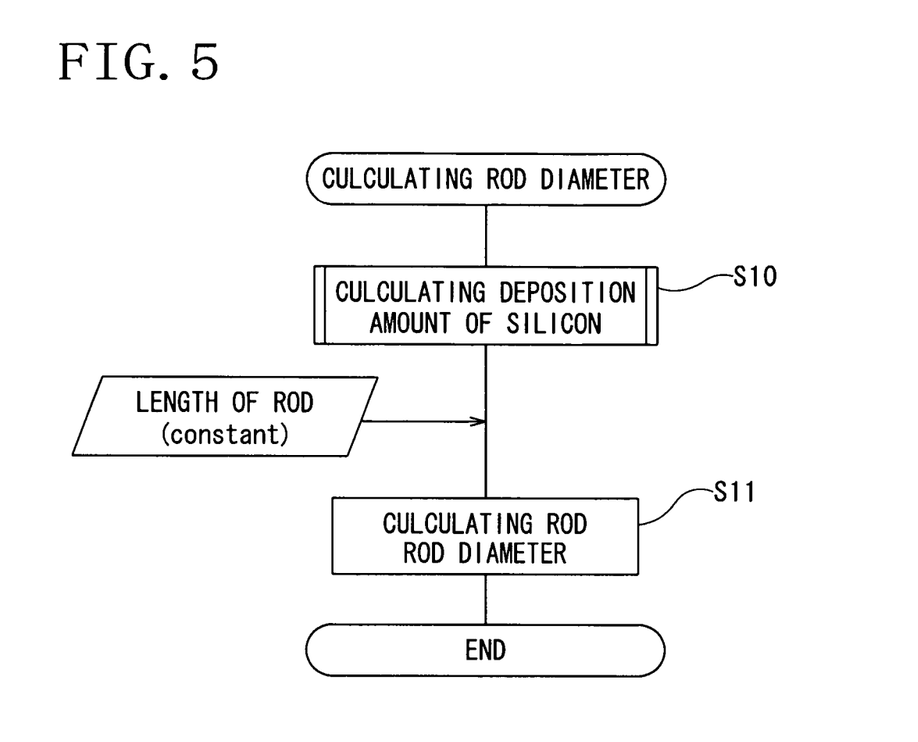
FIG. 5 is a flow chart for calculating a diameter of a silicon rod of the present invention.

Step S4 for calculating the rod diameter RD will be described with reference to FIG. 5. The rod diameter RD is calculated by calculating the deposition amount of polycrystalline silicon in Step S10 as shown in FIG. 4, and then calculating from the deposition amount and the length (constant value) of the rod R in Step S11.

Figure 6:
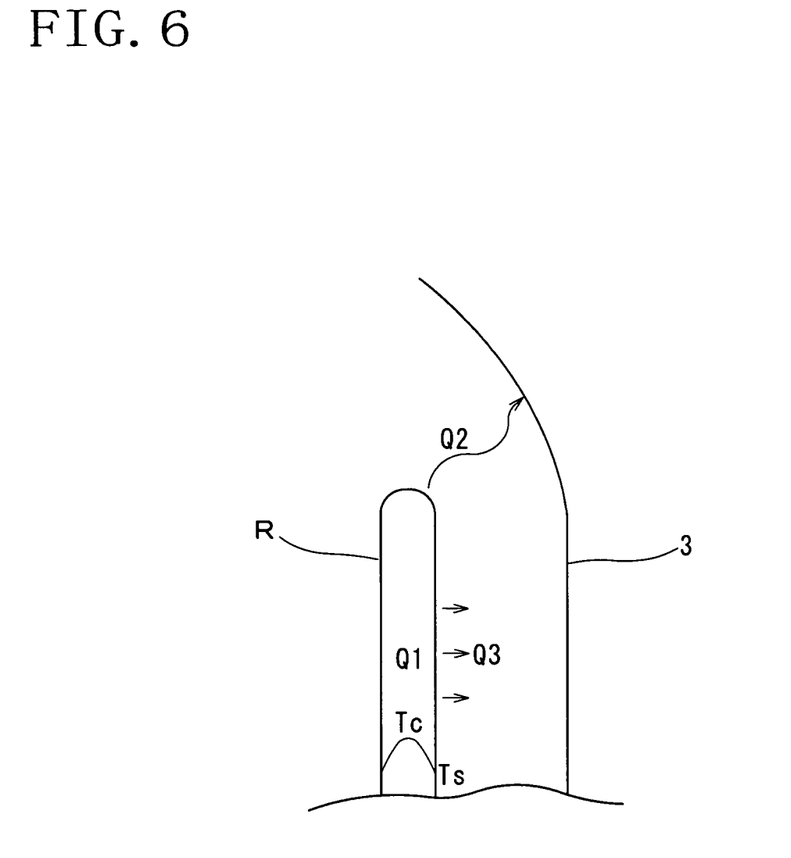
FIG. 6 is a schematic view showing a heat balance of the silicon rod.

When considering the heat balance of the rod of polycrystalline silicon, as schematically shown in FIG. 6, it is necessary to consider a resistance heat-generation quantity Q1 which is generated by supplying a current to the rod R, a heat quantity Q2 transmitting to the wall of the reactor 1 (bell jar 3) by the radiation from the surface of to the rod R, and a heat quantity Q3 escaping from the surface of the rod R to the gas by the convection heat transfer. These heat quantities are required to satisfy the following relationship:

$$Q1=Q2+Q3 \qquad \text{(Equation 1)}$$

The heat quantities are decided by the following variables:
Q1=f(Ts, I, V, RD)
Q2=f(Ts, RD)
Q3=f(F, As, ΔT)

The reference symbol Ts denotes the surface temperature of the rod, the reference symbol "I" denotes the current value, the reference symbol V denotes a voltage, the reference symbol RD denotes the rod diameter, the reference symbol F denotes the supply amount of chlorosilanes (or the raw material gas), the reference symbol As denotes the surface area of the rod, and the reference symbol ΔT denotes a deference between the surface temperature Ts of the rod R and a gas temperature Tg. A quantity and the length of the rods are constant.

Regarding the resistance heat-generation quantity Q1, among variables of Q1=f(Ts, I, V, RD), when the surface temperature Ts, the rod diameter RD, and one of the current value I and the voltage V are decided, Q1 and the remaining variables are decided. The heat quantity Q2 escaping to the wall of the reactor by the radiation from the surface of the rod is decided from the rod surface temperature Ts and the rod diameter RD. The heat quantity Q3 escaping from the surface of the rod to the gas by the convection heat transfer is decided from the supply amount of chlorosilanes F (supply amount of the raw material gas), the rod surface area As, and the deference ΔT between the rod surface temperature Ts and the gas temperature Tg. The gas temperature Tg is a temperature of the gas in the vicinity of the rod. The deference ΔT can be reduced by increasing the supplied gas temperature; and the heat quantity Q3 can be reduced.

In a certain state of the rod diameter RD, if it is desirable to maintain a state of the surface temperature Ts to a prescribed temperature, considering the heat balance of the Equation 1, a total of Q2 and Q3 must be equal to Q1. If ΔT is a certain value, since Q2 and Q3 are determined, Q1 is decided. Since the surface temperature Ts is decided as desired, the current value I is consequently decided. If increasing the supplied gas temperature so as to reduce ΔT, Q3 is reduced, and then Q1 is reduced. Therefore, the center temperature of the rod can be reduced, and thus the meltdown can be prevented.

EXAMPLES

Specific examples will be described below.
In the following examples of the polycrystalline silicon producing process, a reactor was supplied with raw material gas, in which chlorosilanes including trichlorosilane as a main component and 4.5 mol % of dichlorosilane ($SiH_2Cl_2$) were used and mixed with hydrogen ($H_2$), so as to have a molar ratio of $H_2$/chlorosilanes of 8. A supply amount F of chlorosilanes per unit surface area and a pressure in the reactor was set as shown in Tables 1 and 2. A current value was adjusted so that a rod surface temperature Ts was 1100° C. Table 1 shows examples and Table 2 shows comparative examples.

The supply amounts F of chlorosilanes per unit surface area were set to $2.1\times10^{-7}$ mol/sec/mm$^2$ for the examples 1 to 4 and 7, set to $2.6\times10^{-7}$ mol/sec/mm$^2$ for the examples 5 and 6, and set to $3.0\times10^{-7}$ mol/sec/mm$^2$ for the examples 8 and 9. The pre-heat temperature were set to 150° C. for the examples 1 and 3, set to 500° C. for the examples 2, 4 to 6, 8 and 9, and set to 400° C. for the example 7. The pressure were set to 0.4 MPa for the examples 1, 2, 5 and 8, set to 0.6 MPa for the examples 3, 4, 6, 7 and 9.

In the comparative examples, the supply amounts F of chlorosilanes per unit surface area was set to $2.1\times10^{-7}$ mol/sec/mm$^2$. The supply temperature of the raw material gas was set to 100° C. The pressure was set to 0.4 MPa for the comparative example 1, and set to 0.6 MPa for the comparative example 2.

The rod surface temperature was maintained to 1100° C. for the examples 1 to 9 and the comparative examples 1 and 2.

Note, a product amount of silicon per unit time (ton/hr) is obtained as a product amount of silicon per one batch (ton)/a process time (hour).

before the rod diameter reached 100 mm, meltdown occurred, and it was not possible to grow the rod any more. In addition, the purities of the silicon rod of the example 1, 3, and 7 were suitable for semiconductors; however, the purities of the silicon rod of the example 2, 4 to 6, 8, and 9 were low and not suitable for semiconductors.

Next, the following examination was carried out to verify the effect of the adjustment in the supply amount F of chlorosilanes. In comparative examples 3 and 4, as in the above examples, the reactor was supplied with raw material gas, in which chlorosilanes including trichlorosilane as a main component and 4.5 mol % of dichlorosilane ($SiH_2Cl_2$) were used and mixed with hydrogen ($H_2$, so as to have a molar ratio of $H_2$/chlorosilanes of 8. The raw material gas was adjusted so that the supply amounts F of chlorosilanes per unit surface area were set to $1.0\times10^{-7}$ mol/sec/mm$^2$ for the comparative example 3, and set to $3.1\times10^{-7}$ mol/sec/mm$^2$ for the comparative example 4. The pressure was set to 0.4 MPa for the

TABLE 1

|  | supply gas temperature [° C.] | supply amount of chlorosilanes per unit time per unit area [mol/sec/mm$^2$] × 10$^{-7}$ | pressure [MPa] | surface temperature [° C.] | final diameter of rod [mm] | product amount of silicon per unit time [ton/hr] |
|---|---|---|---|---|---|---|
| Example 1 | 150 | 2.1 | 0.4 | 1100 | 100 | 0.047 |
| Example 2 | 500 | 2.1 | 0.4 | 1100 | 116 | 0.054 |
| Example 3 | 150 | 2.1 | 0.6 | 1100 | 100 | 0.050 |
| Example 4 | 500 | 2.1 | 0.6 | 1100 | 115 | 0.056 |
| Example 5 | 500 | 2.6 | 0.4 | 1100 | 102 | 0.055 |
| Example 6 | 500 | 2.6 | 0.6 | 1100 | 102 | 0.058 |
| Example 7 | 400 | 2.1 | 0.6 | 1100 | 111 | 0.055 |
| Example 8 | 500 | 3.0 | 0.4 | 1100 | 101 | 0.059 |
| Example 9 | 500 | 3.0 | 0.6 | 1100 | 100 | 0.063 |

TABLE 2

|  | supply gas temperature [° C.] | supply amount of chlorosilanes per unit time per unit area [mol/sec/mm$^2$] × 10$^{-7}$ | pressure [MPa] | surface temperature [° C.] | final diameter of rod [mm] |
|---|---|---|---|---|---|
| comparative example 1 | 100 | 2.1 | 0.4 | 1100 | meltdown |
| comparative example 2 | 100 | 2.1 | 0.6 | 1100 | meltdown |

As is shown by the results of Table 1 and Table 2, in all examples, it was possible to increase the rod diameter to 100 mm or larger. On the other hand, in the comparative examples, comparative examples 3 and 4. The pre-heat temperature was set to 500° C. for the comparative examples 3 and 4. The results are shown in Table 3.

TABLE 3

|  | supply gas temperature [° C.] | supply amount of chlorosilanes per unit time per unit area [mol/sec/mm$^2$] × 10$^{-7}$ | pressure [MPa] | surface temperature [° C.] | final diameter of rod [mm] | product amount of silicon per unit time [ton/hr] |
|---|---|---|---|---|---|---|
| comparative example 3 | 500 | 1.0 | 0.4 | 1100 | 110 | 0.034 |
| comparative example 4 | 500 | 3.1 | 0.4 | 1100 | meltdown | — |

As shown in Table 3, it was possible to increase the rod diameter to 100 mm or larger in the comparative example 3. However, the product amount of silicon per unit time was very small comparing to the examples shown in Table 1, it took a lot of time to grow the rod to 100 mm or larger. On the other hand, in the comparative example 4, although the supply gas was preheated, the meltdown occurred before the rod diameter increased to 100 mm, and it was not possible to grow the rod any more.

Figure 7:
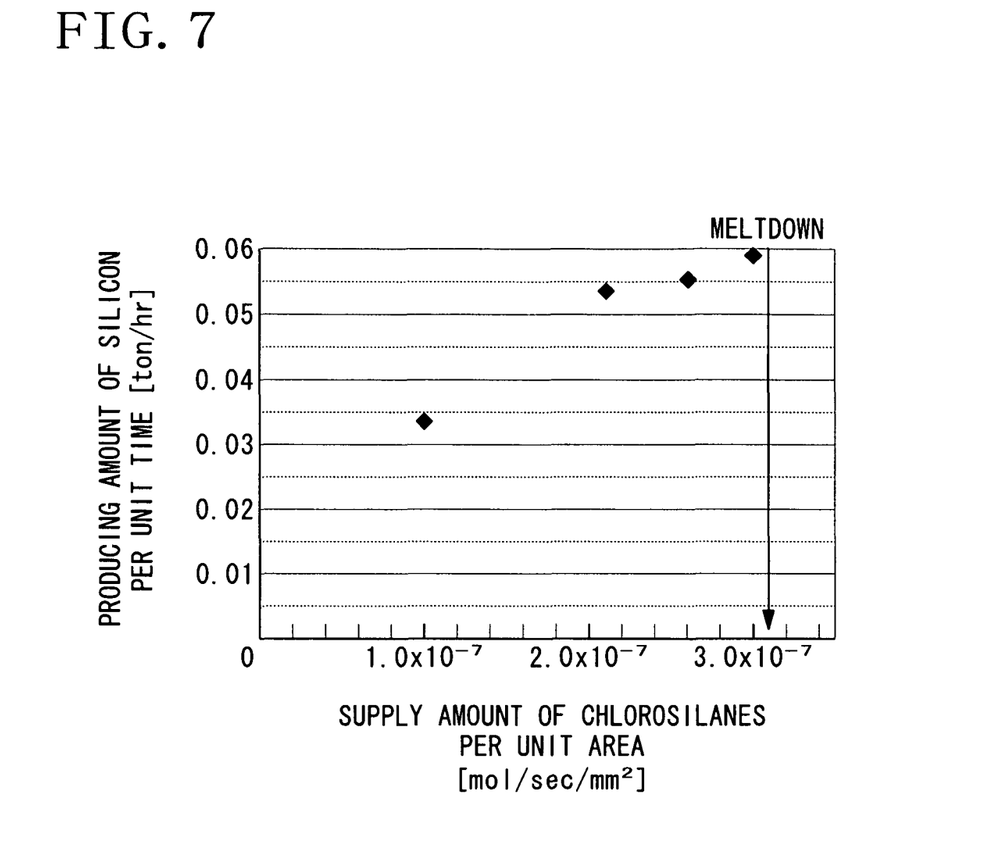
FIG. 7 is a graph showing a relationship between a supply amount of chlorosilanes per unit surface area and a production amount of polycrystalline silicon per unit time.

FIG. 7 shows the relationship between the supply amount of chlorosilanes per unit surface area and the product amount of silicon per unit time with respect to the comparative examples 3 and 4 and the examples 2, 5 and 8. Those examples have the same conditions in which the pressure was 0.4 MPa, the supplied gas temperature was 500° C., and the rod surface temperature was 1100° C., but the supply amounts of chlorosilanes thereof are different from each other. As shown in FIG. 7, it was possible that the rod can grow to 100 mm or larger with high growing rate when the supply amount was large as in the range equal to or greater than $2.0 \times 10^{-7}$ mol/sec/mm$^2$ and equal to or less than $3.0 \times 10^{-7}$ mol/sec/mm$^2$ and the supply gas was preheated in a high-pressure-reducing furnace.

Next, the following examination was carried out to verify the effect of the adjustment in the pressure to the yield. In a comparative example 5, as in the above examples, the reactor was supplied with raw material gas, in which chlorosilanes including trichlorosilane as a main component and 4.5 mol % of dichlorosilane ($SiH_2Cl_2$) were used and mixed with hydrogen ($H_2$), so as to have a molar ratio of $H_2$/chlorosilanes of 8. In the comparative example 5, the supplied gas temperature was set to 500° C. The supply amounts F of chlorosilanes per unit surface area were set to $2.1 \times 10^{-7}$ mol/sec/mm$^2$ as in the examples 2 and 4. The pressure was set to 0.19 MPa. The results are shown in Table 4 with the yields of the examples 2 and 4. The yield is a ratio (molar ratio) of the product amount of silicon to the supplied chlorosilanes.

As shown in Table 4, in the comparative example 5, it was possible to grow the rod to 100 mm or larger. However, the yield of the comparative example 5 was lower than that of the example 2 and 4. That is, by increasing the pressure, silicon can grow with high yield.

Next, the following examination was carried out to verify the effect of to preheating of raw material gas with adjusting the current value so that the surface temperature is 1100° C. under the pressure of 0.9 MPa (refer to Table 5). In a comparative example 6, raw material gas was supplied to the reactor with adjusting temperature thereof to 100° C. and a supply amount thereof so that a supply amount of chlorosilanes were to be $2.1 \times 10^{-7}$ mol/sec/mm$^2$ per unit surface area.

In examples 10 to 12, raw material gas was adjusted so that a supply amount of chlorosilanes was to be $2.1 \times 10^{-7}$ mol/sec/mm$^2$ per unit surface area. In an example 13, raw material gas was adjusted so that a supply amount of chlorosilanes was to be $2.6 \times 10^{-7}$ mol/sec/mm$^2$ per unit surface area. Temperature of the supply gas was set to 150° C. for the example 10, 500° C. for the example 11 and 13, and 600° C. for the example 12.

TABLE 5

| | supply gas temperature [° C.] | supply amount of chlorosilanes per unit time per unit area [mol/sec/mm$^2$] × 10$^{-7}$ | pressure [MPa] | surface temperature [° C.] | final diameter of rod [mm] | product amount of silicon per unit time [ton/hr] |
|---|---|---|---|---|---|---|
| comparative example 6 | 100 | 2.1 | 0.9 | 1100 | meltdown | — |
| example 10 | 150 | 2.1 | 0.9 | 1100 | 100 | 0.051 |
| example 11 | 500 | 2.1 | 0.9 | 1100 | 117 | 0.059 |
| example 12 | 600 | 2.1 | 0.9 | 1100 | 121 | 0.062 |
| example 13 | 500 | 2.6 | 0.9 | 1100 | 103 | 0.061 |

As shown in Table 5, in the comparative example 6 in which the supplied gas temperature was low, meltdown occurred, and it was not possible to grow the rod to 100 mm or larger. On the other hand, in the examples 11 to 13 in which the supplied gas temperature was high, although the pressure and the surface temperature are the same as in the comparative example 6, it was possible to grow the rod to 100 mm or larger.

Figure 8:
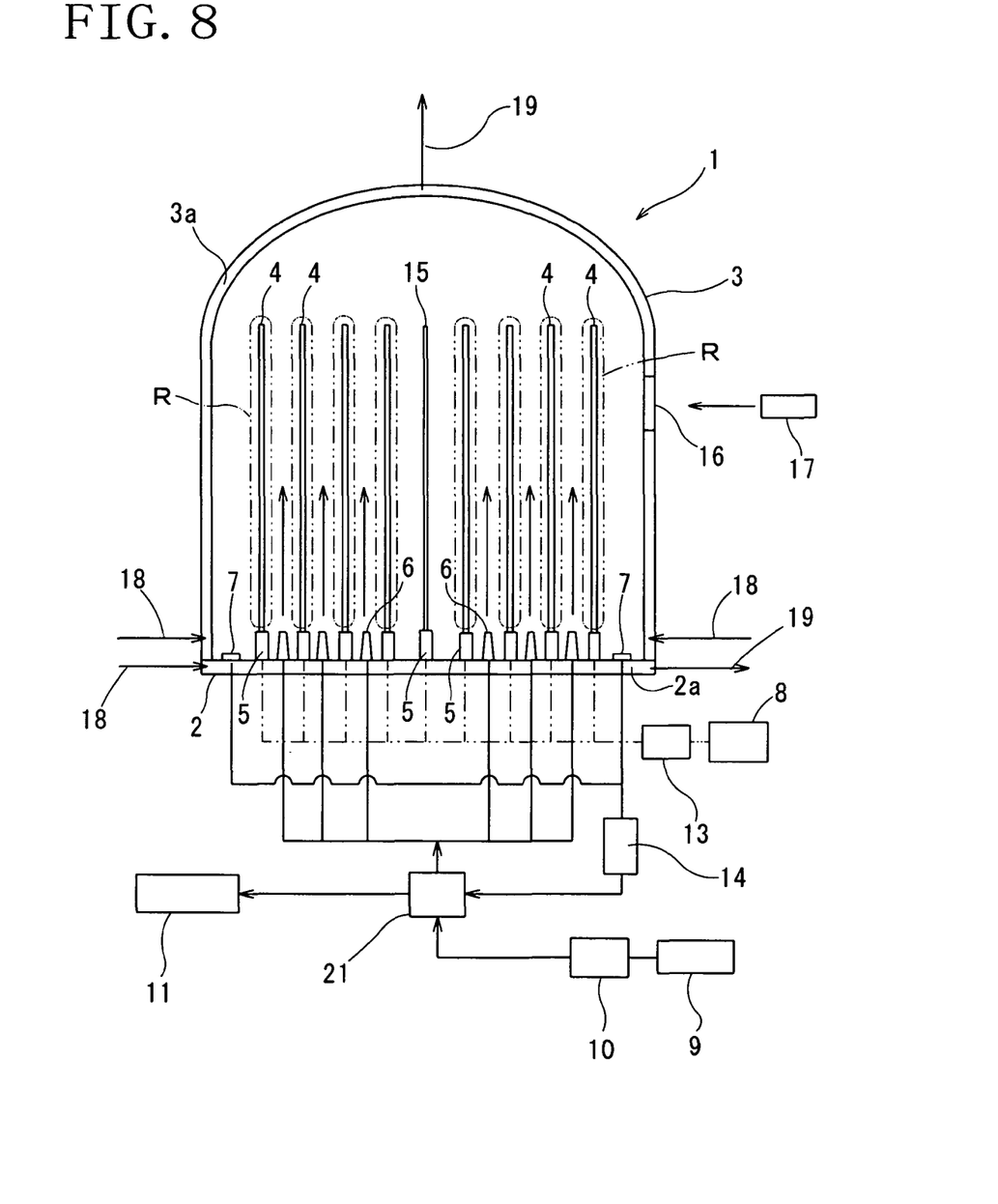
FIG. 8 is a constructive cross-sectional view showing a producing apparatus used in the producing method of polycrystalline silicon according to the other embodiment of the present invention.

When heating the raw material gas, a producing apparatus of polycrystalline silicon shown in FIG. 8 can be used. The producing apparatus of polycrystalline silicon shown in FIG. 8 is provided with a heat exchanger as a pre-heater 21 so as to heat-exchange between the raw material gas and the discharge gas. The raw material gas which is supplied to the reactor 1 can be preheated by flowing the raw material gas to be supplied to the reactor 1 and the high-temperature discharge gas which is discharged from the reactor 1 through the

TABLE 4

| | supply gas temperature [° C.] | supply amount of chlorosilanes per unit area [mol/sec/mm$^2$] × 10$^{-7}$ | pressure [MPa] | surface temperature [° C.] | final diameter of rod [mm] | yield [mol %] |
|---|---|---|---|---|---|---|
| comparative example 5 | 500 | 2.1 | 0.19 | 1100 | 115 | 8 |
| example 2 | 500 | 2.1 | 0.4 | 1100 | 116 | 10 |
| example 4 | 500 | 2.1 | 0.6 | 1100 | 115 | 10 | heat exchanger (pre-heater) 21 so as to heat-exchange each other. Note, in FIG. 8, the same parts as those in FIG. 1 will be denoted by the same symbols and description thereof will be omitted.

Figure 9:
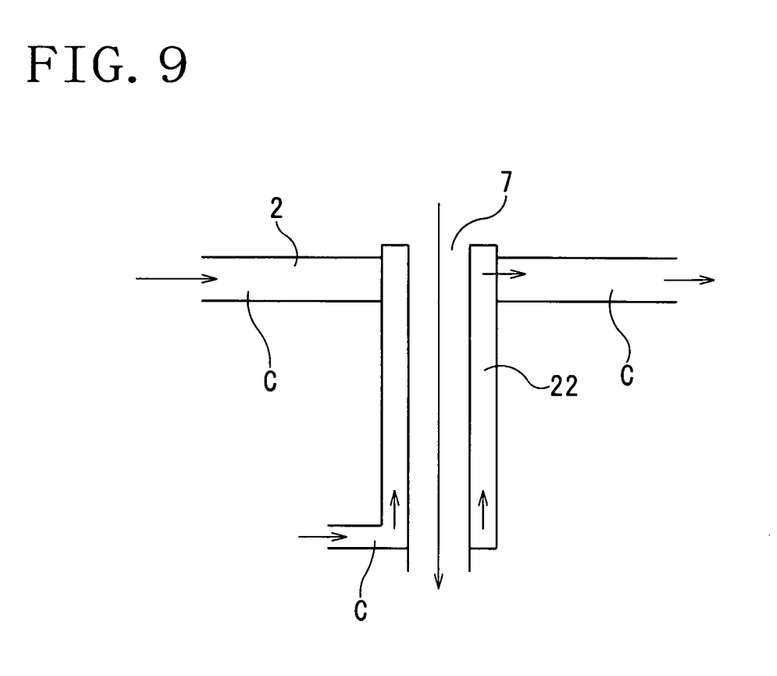
FIG. 9 is a cross-sectional view showing a part of a producing apparatus used in the producing method of polycrystalline silicon according to the other embodiment of the present invention.

However, when the heat exchanger is used for heat-exchanging between the raw material gas and the discharge gas, in a case in which polycrystalline silicon for semiconductors is produced, in order to prevent contamination to the raw material gas by impurity from a heat-transfer surface of the heat exchanger where the raw material gas flows, it is necessary to restrain the temperature of the heat-transfer surface of the heat exchanger from increasing over a certain temperature. As a method for it, it is possible to restrain the temperature, for example as shown in FIG. 9, by a structure in which a pipe 22 is provided as a double pipe between the gas discharge port 7 and the heat exchanger 21 (refer to FIG. 8) in the reactor 1. In this structure, the discharge gas is flown through the inner path of the double pipe; and coolant is flown through the outer path of the double pipe. Diameters, lengths, and thicknesses of the pipes constituting the pipe 22 are appropriately decided.

Next, the following examination was carried out to verify the effect of setting the surface temperature of the silicon rods equal to or higher than 1000° C. and equal to or lower than 1100° C. (refer to Table 6). In below examples, the reactor was supplied with raw material gas, in which chlorosilanes including trichlorosilane as a main component and 4.5 mol % of dichlorosilane ($SiH_2Cl_2$) were used and mixed with hydrogen ($H_2$), so as to have a molar ratio of $H_2$/chlorosilanes of 8. The supply amounts F of chlorosilanes per unit surface area were set to $2.1 \times 10^{-7}$ mol/sec/mm². The pressure was set to 0.9 MPa. The pre-heat temperature was set to 600° C. The results of producing silicon in cases in which the surface temperature of the silicon rod differ are shown in Table 6.

that the product amount of silicon per unit time and unit of chlorosilanes can be increased. When controlling the temperature of the wall of the reactor, in order to restrain the radiation and the convection from the rod, it is preferable that the wall be maintained equal to or higher than 250° C. and equal to or lower than 400° C. If the temperature of the wall excessively increased, there is a possibility that impurities contaminate the atmosphere in the reactor from the wall components. Therefore, the upper limit of the temperature may be 400° C.

As described above, the electrodes holding the silicon seed rods are disposed in a substantially concentric pattern in the reactor. In addition, when a structure in which no ejection nozzles are disposed between the inner surface of the reactor wall and the electrodes positioned at the outermost circumference is applied, that is, when a structure in which the electrodes (i.e., the silicon seed rods) are disposed between the ejection nozzles and the reactor wall is applied, the convection heat transfer from the outermost rod to atmosphere gas can preferably restrained. Since the outermost rods are directly opposed to the inner wall of the reactor, meltdown is easily caused by a large heat quantity that is transmitted to the inner wall of the reactor by the radiation from the surface of the rod in addition to the acceleration of the convection heat transfer by the raw material gas from the ejection nozzles. If no ejection nozzles are disposed there, the convection heat transfer from the rods to the gas can be restrained, so that the meltdown can be prevented.

In the raw material gas, the molar ratio of $H_2$/chlorosilanes is set to 8 in the above embodiments. However, the raw material gas is not limited thereto. For example, it is desirable for the molar ratio to be equal to or greater than 5 and equal to

TABLE 6

| | supply gas temperature [° C.] | supply amount of chlorosilanes per unit time per unit area [mol/sec/mm²] × 10⁻⁷ | pressure [MPa] | surface temperature [° C.] | final diameter of rod [mm] | product amount of silicon per unit time [ton/hr] |
|---|---|---|---|---|---|---|
| comparative example 8 | 600 | 2.1 | 0.9 | 970 | 123 | 0.013 |
| example 14 | 600 | 2.1 | 0.9 | 1020 | 126 | 0.038 |
| example 15 | 600 | 2.1 | 0.9 | 1050 | 126 | 0.050 |
| example 12 | 600 | 2.1 | 0.9 | 1100 | 122 | 0.062 |
| comparative example 9 | 600 | 2.1 | 0.9 | 1150 | meltdown | — |

As shown in FIG. 6, in the examples 14, 15, and 12 in which the surface temperature was set equal to or higher than 1000° C. and equal to or lower than 1100° C., it was possible to grow the silicon rod without meltdown. However, in the comparative example 9 in which the surface temperature was high, the meltdown occurred. On the other hand, in the comparative example 8 in which the surface temperature was low, although it was possible to grow the rod to 100 mm or lager, the product amount of silicon per unit time was low, and the growing rate of polycrystalline silicon was awfully small.

The present invention is not limited to the above-described embodiments and various modifications may be made without departing from the scope of the present invention.

For example, by adjusting the temperature and flow rate of the coolant circulated in the double-walled interior space of the reactor, the temperature of the inner wall of the reactor may be maintained high. Accordingly, the heat loss owing to the radiation and the convection from the rod is reduced, so or less than 10 so as not to deposit polycrystalline silicon in the vapor phase and in order to rapidly grow the rod. The molar ratio may be changed during the polycrystalline silicon producing process.

In the raw material gas, $SiH_4$, $Si_2H_6$ and the like may be included and the present invention also can be applied to a method of producing polycrystalline silicon by an ASiMi method, in which $SiH_4$ is used as a main component, other than the Siemens method.

Also, in the above-described embodiments, the rod diameter is obtained from the analysis result of a gas chromatograph or the like. However, the rod diameter may be directly measured from the observation window. When the rods overlap and the rods installed at the center portion cannot be confirmed, the diameter of rods disposed at the outermost circumference may be used as a representative value. The method disclosed in Japanese Unexamined Patent Application, First Publication No. 2001-146999 also may be applied.

What is claimed is:

1. A polycrystalline silicon producing method comprising:
supplying electric current to at least one silicon seed rod in a reactor to make the silicon seed rod to generate heat;
supplying raw material gas including chlorosilanes in the reactor in which the silicon seed rod is provided; and
depositing polycrystalline silicon on a surface of the silicon seed rod to be grown as a silicon rod, wherein
a pressure in the reactor is maintained in a range equal to or greater than 0.4 MPa and equal to or less than 0.9 MPa,
a surface temperature of the silicon rod is maintained in a range equal to or higher than 1000° C. and equal to or lower than 1100° C.,
the raw material gas is preheated to a range equal to or higher than 150° C. and equal to or lower than 600° C. and then supplied to the reactor so as to maintain a chlorosilanes supply amount per unit time and per unit surface area in a range equal to or greater than $2.0 \times 10^{-7}$ mol/sec/mm² and equal to or less than $3.0 \times 10^{-7}$ mol/sec/mm² with growth of the diameter of the silicon rod.

2. The polycrystalline silicon producing method according to claim 1, wherein the raw material gas is preheated by heat exchange between a discharge gas from the reactor and the raw material gas before being supplied to the reactor.

3. The polycrystalline silicon producing method according to claim 2,
wherein temperature of an inner surface of the reactor is adjusted to be equal to or higher than 250° C. and equal to or lower than 400° C.

4. The polycrystalline silicon producing method according to claim 2,
wherein in the reactor, a raw material gas-supply nozzle is disposed further from an inner surface of the reactor than the silicon seed rod positioned at the outermost circumference.

5. The polycrystalline silicon producing method according to claim 2,
wherein the pre-heat temperature of the raw material gas is in a range equal to or higher than 150° C. and equal to or lower than 400° C.

6. The polycrystalline silicon producing method according to claim 1,
wherein temperature of an inner surface of the reactor is adjusted to be equal to or higher than 250° C. and equal to or lower than 400° C.

7. The polycrystalline silicon producing method according to claim 6,
wherein in the reactor, a raw material gas-supply nozzle is disposed further from an inner surface of the reactor than the silicon seed rod positioned at the outermost circumference.

8. The polycrystalline silicon producing method according to claim 6, wherein the pre-heat temperature of the raw material gas is in a range equal to or higher than 150° C. and equal to or lower than 400° C.

9. The polycrystalline silicon producing method according to claim 1, wherein in the reactor, a raw material gas-supply nozzle is disposed further from an inner surface of the reactor than the silicon seed rod positioned at the outermost circumference.

10. The polycrystalline silicon producing method according to claim 9, wherein the pre-heat temperature of the raw material gas is in a range equal to or higher than 150° C. and equal to or lower than 400° C.

11. The polycrystalline silicon producing method according to claim 1, wherein the pre-heat temperature of the raw material gas is in a range equal to or higher than 150° C. and equal to or lower than 400° C.

* * * * *